United States Patent
Lee et al.

(10) Patent No.: US 6,727,135 B2
(45) Date of Patent: Apr. 27, 2004

(54) ALL-IN-ONE DISPOSABLE/PERMANENT SPACER ELEVATED SOURCE/DRAIN, SELF-ALIGNED SILICIDE CMOS

(75) Inventors: Kam Leung Lee, New York, NY (US); Ronnen Andrew Roy, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/464,339

(22) Filed: Jun. 18, 2003

(65) Prior Publication Data
US 2003/0209765 A1 Nov. 13, 2003

Related U.S. Application Data (62) Division of application No. 09/909,307, filed on Jul. 19, 2001, now Pat. No. 6,614,079.

(51) Int. Cl.⁷ .......................................... H01L 21/8238
(52) U.S. Cl. ...................... 438/230; 438/231; 438/232; 438/199; 438/585
(58) Field of Search ................................ 438/230, 231, 438/232, 229, 199, 585

(56) References Cited

U.S. PATENT DOCUMENTS

| | | | |
|---|---|---|---|
| 4,818,714 A | * 4/1989 | Haskell | 438/231 |
| 4,843,023 A | * 6/1989 | Chiu et al. | 438/231 |
| 5,716,862 A | 2/1998 | Ahmad et al. | 438/302 |
| 6,025,267 A | 2/2000 | Pey et al. | 438/656 |
| 6,087,234 A | * 7/2000 | Wu | 438/299 |
| 6,087,235 A | * 7/2000 | Yu | 438/303 |
| 6,165,826 A | 12/2000 | Chau et al. | 438/231 |
| 6,177,323 B1 | * 1/2001 | Wu | 438/300 |
| 6,197,648 B1 | * 3/2001 | Kasai et al. | 438/305 |
| 6,228,730 B1 | * 5/2001 | Chen et al. | 438/301 |
| 6,277,683 B1 | * 8/2001 | Pradeep et al. | 438/200 |

* cited by examiner

Primary Examiner—Michael Trinh
(74) Attorney, Agent, or Firm—Scully, Scott, Murphy & Presser; Wan Yee Cheung (57) ABSTRACT

A complementary metal oxide semiconductor (CMOS) device having silicide contacts that are self-aligned to deep junction edges formed within a surface of a semiconductor substrate as well as a method of manufacturing the same are disclosed. Specifically, the CMOS device includes a plurality of patterned gate stack regions formed on a surface of a semiconductor substrate. Each plurality of patterned gate stack regions includes an L-shaped nitride spacer formed on exposed vertical sidewalls thereof, the L-shaped nitride spacer having a vertical element and a horizontal element, wherein the horizontal element is formed on a portion of the substrate that abuts each patterned gate stack region. Silicide contacts are located on other portions of the semiconductor substrate between adjacent patterned gate stack regions not containing the horizontal element of the L-shaped nitride spacer.

22 Claims, 4 Drawing Sheets

ALL-IN-ONE DISPOSABLE/PERMANENT SPACER ELEVATED SOURCE/DRAIN, SELF-ALIGNED SILICIDE CMOS

RELATED APPLICATIONS

This application is a divisional of U.S. application Ser. No. 09/909,307, U.S. Pat. No. 6,614,079 filed Jul. 19, 2001, which is related to co-assigned U.S. application Ser. No. 09/736,877, filed Dec. 14, 2000, by K. Lee, et al., the entire content of which is incorporated herein by reference.

DESCRIPTION

1. Field of the Invention

The present invention relates to complementary metal oxide semiconductor (CMOS) devices, and more particularly to a process and structure for forming a metal oxide semiconductor field effect transistor (MOSFET), wherein gate sidewall composite spacers, which are partially removed during device processing, are employed. The present invention thus provides a method to form low temperature silicide contacts that are self-aligned to the deep junction edges present in the device, while still achieving the lower thermal budget of a conventional disposable spacer process.

2. Background of the Invention

As CMOS technology becomes smaller and smaller, e.g., less than about 50 nm gate length, it becomes more and more difficult to improve the short channel device performance and at the same time maintain acceptable values for off-state leakage current.

One technique for achieving this is a halo technique wherein extra dopant implant regions are formed next to the source/drain extension regions. For this prior art method to work, the junctions must be abrupt, see "CMOS Devices below 0.1 nm: How High Will Performance Go?" by Y. Taur, et al., pp. 1–4. In particular, for sub-50 nm devices, not only the extension regions near the channel must be abrupt, i.e., less than 4 nm/decade, but the halo profile in proximity to the extension junction must be abrupt, i.e., less than 20 nm/decade.

In the prior art, halo formation is typically carried out by a general approach wherein the halo dopants are implanted at an angle ranging from 0° to about 70° into the channel region. This prior art approach varies either the dose, the type of halo dopant or angle of halo implants for improving device performance.

In the article entitled "Halo Doping Effects in Submicron DI-LDD Device Design" by Christopher Codella, et al., pp. 230–233, there is described the optimum halo doses for improving the threshold voltage $V_t$ and the punch-through device characteristics. Punch-through stoppers were also discussed in U.S. Pat. No. 5,320,974 to Hori, et al., which is similar to the conventional halo arrangements.

The article entitled "A 0.1 nm IHLATI (Indium Halo by Large Angle Tilt Implant) MOSFET for 1.0V Low Power Application" by Young Jin Choi, et al. describes the use of an indium halo implant and a large angle tilt for the indium halo implant which improves the short channel device characteristics of the device.

Other related articles in this field of endeavor include: "High Carrier Velocity and Reliability of Quarter-Micron SPI (Self-Aligned Pocket Implantation) MOSFETs" by A. Hori, et al. and "A 0.1-$\mu$m CMOS Technology with Tilt-Implanted Punch-through Stopper (TIPS)" by T. Hori.

None of the above cited prior art references provides a method of improving the abruptness of the halo dopant profiles in the area next to the channel. Instead, in the prior art processes, the halo implants will suffer enhanced transient diffusion during extension junction and high thermal budget deep source/drain rapid thermal annealing (typically on the order of about 1000° C. for about 5 seconds). Consequently, these much degraded halo implant regions severely compromise their usefulness for improving short channel device characteristics, which is especially the case for device channel widths below 50 nm. Thus, all the prior art approaches provide no means to minimize transient enhanced diffusion of the halo dopants and hence the prior art approaches are not capable of creating abrupt super-halo implants in the region next to the channel region.

Another problem with prior art approaches is that permanent spacers are typically required to be formed on the structure after junction formation, but prior to low-temperature silicidation. The permanent spacers are employed in the prior art to keep the silicide formed over the junctions away from the gate region. That is, if permanent spacers are not employed, the silicide contact may bridge onto the gate region. Hence, the silicide regions formed in the prior art are not self-aligned to the deep junction edge. Additionally, such a prior art approach may result in the junction being deactivated since the dopants solubility is lower at the silicidation temperature and the dopants can move off of substitutional lattice sites.

In view of the drawbacks mentioned hereinabove regarding prior art approaches, there is a continued need for providing a new and improved method to form low temperature silicide contacts which are self-aligned to the deep junction edges. Additionally, a method is also needed that is capable of making abrupt shallow junctions and halo implants that do not require a large post-halo thermal budget.

SUMMARY OF THE INVENTION

One object of the present invention is to provide a method of fabricating a complementary metal oxide semiconductor (CMOS) device that includes a low temperature silicide that is self-aligned to the deep junction edges present in the device.

Another object of the present invention is to provide a method wherein a low thermal budget is used in fabricating a CMOS device.

A further object of the present invention is to provide a method of fabricating a CMOS device that includes a self-aligned silicide region that is formed without the need of a second spacer.

A yet further object of the present invention is to fabricate a raised or non-raised source/drain (S/D) CMOS device, wherein all high temperature processes, such as source/drain anneals and selective epi growth, are performed prior to halo formation.

A still further object of the present invention is to provide a method of fabricating a CMOS device having abrupt junction profiles therein.

These and other objects and advantages are achieved in the present invention by utilizing a gate sidewall composite spacer, which is partially removed during device processing. The inventive method is capable of forming low temperature silicide contacts which are self-aligned to the deep junction edges, while still achieving the low thermal budget of conventional disposable spacer processes.

The inventive spacer is formed by deposition of a bilayer of a thin nitride followed by a thicker Si-containing film and subsequent patterning to form sidewall spacers. The source/drain regions defined by the sidewall spacer are then formed via ion implantation, after which the thick Si-containing layer of the spacer is removed, leaving the thin nitride layer of the composite spacer on the structure. The nitride layer is thereafter etched so as to form L-shaped nitride spacer on the structure. Source/drain extension regions and halo implant regions are formed by implanting through the thin horizontal elemental of the L-shaped nitride spacers. Subsequently, this allows for the formation of silicide contacts that are self-aligned to the source/drain junction, without the need for deposition of a second, non-self aligned spacer.

The inventive method thus allows for the fabrication of a raised or non-raised S/D CMOS device with all high temperature processes such as source/drain anneals and selective epi growth occurring prior to halo formation. Moreover, the inventive method provides a manner to align the subsequent silicide contact away from the shallow junction. The method of the present invention also eliminates the need to form any separate permanent spacer. Other disposable spacer schemes known to the inventors do not have a built-in method to align the silicide contact after halo formation. Moreover, the prior art schemes require a permanent spacer which does not permit self-alignment of the silicide contact and junction edges.

One aspect of the present invention thus relates to a CMOS device which includes an L-shaped nitride spacer formed on each vertical gate sidewall. Specifically, the inventive CMOS device comprises:

a plurality of patterned gate stack regions formed on a surface of a semiconductor substrate, wherein said plurality of patterned gate stack regions each includes an L-shaped nitride spacer formed on exposed vertical sidewalls thereof, said L-shaped nitride spacer having a vertical element and a horizontal element, said horizontal element is formed on a portion of said substrate that abuts the patterned gate stack region; and silicide contacts formed on other portions of said semiconductor substrate between adjacent patterned gate stack regions not containing said horizontal element of said L-shaped nitride spacer, said silicide contacts being self-aligned to deep junction edges formed in said semiconductor substrate.

In one embodiment of the present invention, the silicide contacts are formed on a selective epitaxial Si layer that is grown on the surface of the semiconductor substrate.

Another aspect of the present invention relates to a method of forming the aforementioned CMOS device. Specifically, the inventive method comprises the steps of:

(a) providing a plurality of patterned gate stack regions on a surface of a semiconductor substrate, wherein each of said patterned gate stack regions includes exposed vertical sidewalls;
(b) forming a composite spacer on each exposed vertical sidewall, said composite spacer including a bilayer comprising a nitride layer and a Si-containing film, wherein said Si-containing film is thicker than said nitride layer and is formed on said nitride layer;
(c) forming deep source and drain regions in said surface of said semiconductor substrate;
(d) removing said Si-containing film and forming shallow junctions in said semiconductor substrate in areas abutting each of said patterned gate stack regions;
(e) removing portions of said nitride layer so as to form an L-shaped nitride spacer on each vertical sidewall of said patterned gate stack regions and activating said source and drain regions; and
(f) forming silicide contacts in exposed regions of said semiconductor substrate not containing said L-shaped nitride spacer.

In one embodiment of the present invention, a selective epi Si layer is formed on exposed regions of the semiconductor substrate, after junction formation, but prior to performing step (f). This embodiment of the present invention forms raised source/drain areas in the CMOS device.

In another embodiment of the present invention, halo and source/drain extension regions are formed in the substrate after formation of the source/drain regions, but prior to forming the silicide contact.

DETAILED DESCRIPTION OF THE INVENTION

The present invention, which is directed to a method and process for forming CMOS devices using a gate sidewall composite spacer that is partially removed during device processing, will now be described in greater detail by referring to the drawings that accompany the present application. It is noted that in the accompanying drawings, like and/or corresponding elements are referred to by like reference numerals.

Figure 1:
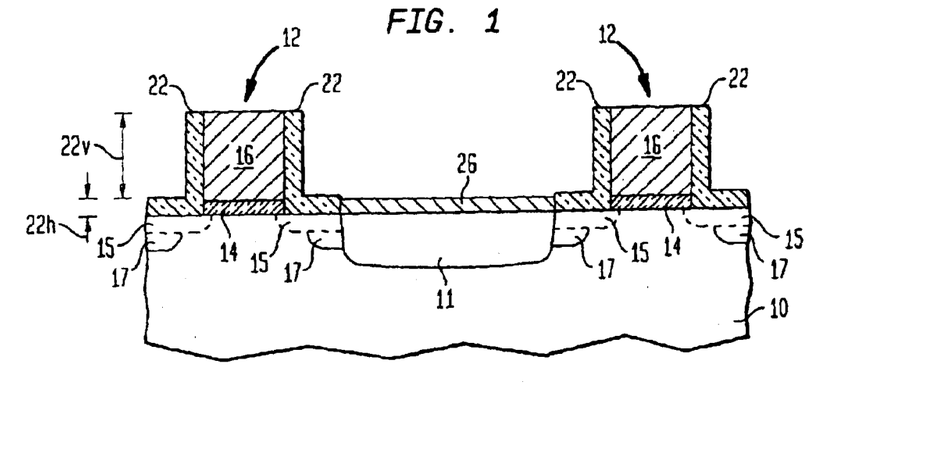
FIG. 1 is a pictorial representation (through a cross-sectional view) showing the inventive CMOS device of the present invention.

Reference is first made to FIG. 1 which shows the basic CMOS device of the present invention. Specifically, the structure shown in FIG. 1 comprises semiconductor substrate 10 having a plurality of patterned gate stack regions 12 formed thereon. Each patterned gate stack region includes at least gate dielectric 14 and gate material 16. In accordance with the present invention, L-shaped nitride spacer 22, which includes vertical element 22$v$ and horizontal element 22$h$, is formed on each exposed vertical sidewall on the patterned gate stack regions. Note that horizontal element 22$h$ of the L-shaped nitride spacer is formed on a portion of semiconductor substrate 10, whereas the vertical element of the L-shaped nitride spacers is formed on the vertical sidewalls of the patterned gate regions.

As shown in FIG. 1, semiconductor substrate 10 includes deep source/drain regions 11, shallow junction regions (not shown in the drawings), source/drain extension regions 15 and halo implant regions 17. The CMOS device shown in FIG. 1 also includes silicide contacts 26 that are formed on exposed surfaces of the semiconductor substrate 10 that do not include horizontal element 22$h$ of L-shaped nitride spacer 22. An important feature of the structure illustrated in FIG. 1 is the L-shaped nitride spacer which permits the formation of silicide contacts 26 that are self-aligned to the deep junction vertical edge present in the substrate. Such self-alignment of the silicide contacts with the deep junction edge as well as allowing the formation of shallow junctions is not achieved using any prior art process known to the inventors.

Figure 2A:
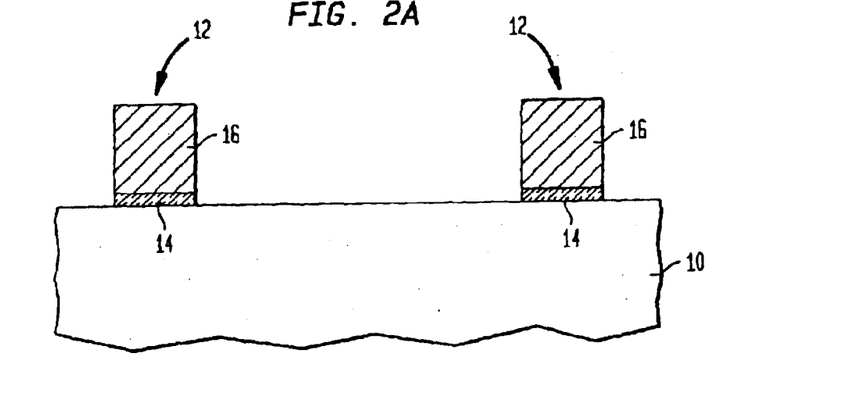
FIGS. 2A–2F are pictorial representations (through cross-sectional views) showing the basic processing steps of the present invention.

The various processing steps and materials used in fabricating the CMOS device shown in FIG. 1, together with various embodiments thereof, will now be described in greater detail by referring to the discussion that follows. Reference is first made to FIG. 2A which illustrates an initial structure that is employed in the present invention. Specifically, the initial structure shown in FIG. 2A comprises semiconductor substrate 10 having a plurality of patterned gate stack regions 12 formed on portions of the semiconductor substrate. In accordance with the present invention, each patterned gate stack region includes at least gate dielectric 14 and gate material 16 formed atop the gate dielectric.

The structure shown in FIG. 2A is comprised of conventional materials well known in the art and it is fabricated utilizing processing steps that are also well known in the art. For example, semiconductor substrate 10 comprises any semiconducting material including, but not limited to: Si, Ge, SiGe, GaAs, InAs, InP and all other III/V semiconductor compounds. Semiconductor substrate 10 may also include a layered substrate comprising the same or different semiconducting material, e.g., Si/Si or Si/SiGe, as well as a silicon-on-insulator (SOI) substrate. The substrate may be of the n- or p-type depending on the desired device to be fabricated.

Additionally, semiconductor substrate 10 may contain active device regions, wiring regions, isolation regions or other like regions that are typically present in CMOS devices. For clarity, these regions are not shown in the drawings, but are nevertheless meant to be included within region 10. In one highly preferred embodiment of the present invention, semiconductor substrate 10 is comprised of Si or an SOI substrate. When an SOI substrate is employed, the CMOS device of the present invention is fabricated on the top Si-containing layer of the SOI substrate which is present above a buried oxide region.

A layer of gate dielectric material 14, such as an oxide, nitride, oxynitride or any combination and multilayer thereof, is then formed on a surface of semiconductor substrate 10 utilizing a conventional process well known in the art. For example, the layer of gate dielectric material may be formed by utilizing a conventional deposition process such as chemical vapor deposition (CVD), plasma-assisted CVD, evaporation or chemical solution deposition, or alternatively, the gate dielectric material may be formed by a thermal growing process such as oxidation, nitridation or oxynitridation.

The thickness of the layer of gate dielectric material formed at this point of the present invention is not critical to the present invention, but typically, gate dielectric 14 has a thickness of from about 1 to about 20 nm after deposition, with a thickness of from about 1.5 to about 10 nm being more highly preferred. It is noted that the gate dielectric material employed in the present invention may be a conventional dielectric material such as $SiO_2$ or $Si_3N_4$, or alternatively, high-k dielectrics such as oxides of Ta, Zr, Hf, Al or combinations thereof may be employed. In one highly preferred embodiment of the present invention, gate dielectric 14 is comprised of an oxide such as $SiO_2$, $ZrO_2$, $Ta_2O_5$, $HfO_2$ or $Al_2O_3$.

After forming gate dielectric 14 on a surface of semiconductor substrate 10, a gate stack including at least gate material 16 which may further contain an optional dielectric capping layer formed thereon is formed on gate dielectric 14. The term "gate material" as used herein denotes a conductive material, a material that can be made conductive via a subsequent process such as ion implantation, or any combination thereof. Illustrative examples of suitable gate materials that can be employed in the present invention include, but are not limited to: polysilicon, amorphous silicon, elemental metals that are conductive such as W, Pt, Pd, Ru, Rh and Ir, alloys of these elemental metals, silicides or nitrides of these elemental metals, and combinations thereof, e.g., a gate stack including a layer of polysilicon and a layer of conductive metal. A highly preferred gate material employed in the present invention is a gate material that is comprised of polysilicon or amorphous silicon.

The gate material is formed on the surface of gate dielectric 14 utilizing conventional deposition processes well known in the art including, but not limited to: CVD, plasma-assisted CVD, evaporation, plating, or chemical solution deposition. When metal silicides are employed, a conventional silicide process may be used in forming the silicide layer. One such silicide process that can be used in the present invention includes the steps of: first forming an elemental metal such as W, Co, or Ti, annealing the layers so as to form a metal silicide layer therefrom, and removing any unreacted elemental metal utilizing a conventional wet etch process that has a high selectivity for removing elemental metal as compared to silicide.

It is noted that in embodiments wherein the gate stack includes multilayers, e.g., a stack of polysilicon and elemental metal, an optional diffusion barrier (not shown in the drawings) may be formed between each layer of the gate stack. The optional diffusion barrier, which is formed utilizing conventional deposition processes such as those mentioned hereinabove, is comprised of a material such as SiN, TaN, TaSiN, WN, TiN and other like materials which can prevent diffusion of a conductive material therethrough.

As stated above, an optional dielectric capping layer may be present atop the gate material. When present, the optional dielectric capping layer is comprised of an oxide, nitride or oxynitride and it is formed utilizing a conventional deposition process such as, for example, CVD or plasma-assisted CVD. Alternatively, a conventional thermal growing process such as, for example, oxidation, may be used in forming the optional dielectric capping layer.

After forming the gate stack on the gate dielectric, the gate stack and the gate dielectric are then patterned utilizing conventional processing steps well known in the art which are capable of forming patterned gate stack regions 12 shown in FIG. 2A. Specifically, the patterning shown in FIG. 2A is formed by lithography and etching.

The lithography step includes the following: applying a photoresist (not shown in the drawings) to the top surface of the gate stack, exposing the photoresist to a pattern of radiation and developing the pattern utilizing a conventional resist developer solution.

Etching is performed utilizing a conventional dry etching process such as reactive-ion etching, plasma etching, ion beam etching, laser ablation or any combination thereof. The etching step may remove portions of the gate stack and the underlying gate dielectric material that are not protected by the patterned photoresist in a single step, or alternatively, multiple etching steps may be performed wherein the exposed portions of the gate stack is first removed stopping on a surface of the gate dielectric, and thereafter the exposed portions of the gate dielectric are removed stopping on the surface of semiconductor substrate 10. Following the etching process, the patterned photoresist is removed utilizing a conventional stripping process well known in the art providing the structure shown, for example, in FIG. 2A.

In one embodiment of the present invention, the patterned gate stack regions are subjected to a conventional reoxidation process prior to proceeding to the next step of the present invention.

Figure 2B:
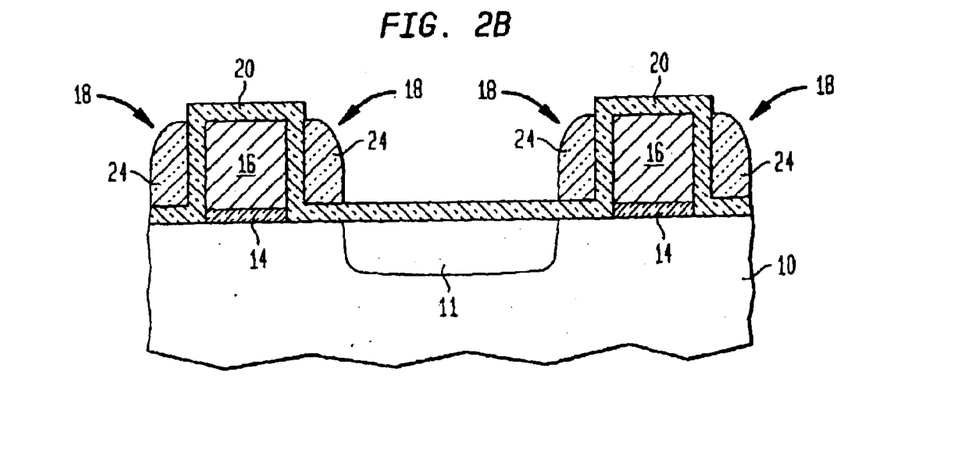

Next, and as is illustrated in FIG. 2B, composite spacers 18 which include a bilayer of thin nitride 20 followed by a thicker Si-containing film 24 such as silicon or silicon oxide are formed on exposed vertical sidewalls of each patterned gate stack region. Spacers 18 may be formed by first depositing a conformal nitride layer (via chemical vapor deposition or a similar conformal deposition process) on the structure shown in FIG. 2A, depositing a Si-containing film (via a conventional deposition process) on the nitride layer, and thereafter etching the Si-containing film (via an anisotropic spacer etch process). Note that nitride layer 20 remains on the structure after the Si-containing film has been etched. A preferred nitride layer employed in the present invention is $Si_3N_4$.

The thickness of the conformal nitride layer formed at this point of the present invention is from about 3 to about 50 nm, with a thickness of from about 5 to about 35 nm being more highly preferred. Insofar as the Si-containing film is concerned, that film has a thickness, after etching, of from about 20 to about 200 nm, with a thickness of from about 30 to about 150 nm being more highly preferred. Note that the above thickness are exemplary and that other thickness are also contemplated in the present invention.

With composite spacers 18 in place, deep source/drain regions 11 are implanted into the surface of semiconductor substrate 10 utilizing a conventional ion implantation process well known in the art. The term "deep source/drain regions" is used herein to denote implant regions whose maximum implant depth is proportional to spacer 24 width, which from the top surface of the substrate is from about 30 to about 200 nm. It is noted that at this point of the present invention, it is also possible to implant dopants within the gate material. Various ion implantation conditions may be used in forming the deep source/drain regions within the substrate, but typically the ion implantation used in forming the deep source/drain regions is carried out at a dopant dosage of about $1E15$ $cm^{-2}$ or greater using an implant energy of about 5 keV or greater. More preferably, the ion implantation used in forming the deep source/drain regions is carried out at a dopant dosage of from about $2E15$ to about $2E16$ $cm^{-2}$ using an implant energy of from about 7 to about 50 keV.

In one embodiment of the present invention, the source/drain regions may be activated at this point of the present invention utilizing conventional activation annealing conditions well known to those skilled in the art. Although such an embodiment is possible, it is highly preferred to delay the activation of the S/D regions. The source/drain regions may be activated by annealing at a temperature of about 900° C. or greater, for a time period of from about 30 seconds or less. Other annealing conditions which are capable of activating the source/drain regions may also be employed in the present invention. It is again emphasized that although the source/drain regions may be activated at this point of the present invention, it is highly preferred to delay the activation of the source/drain regions until after shallow junction regions have been formed in the substrate.

Figure 2C:
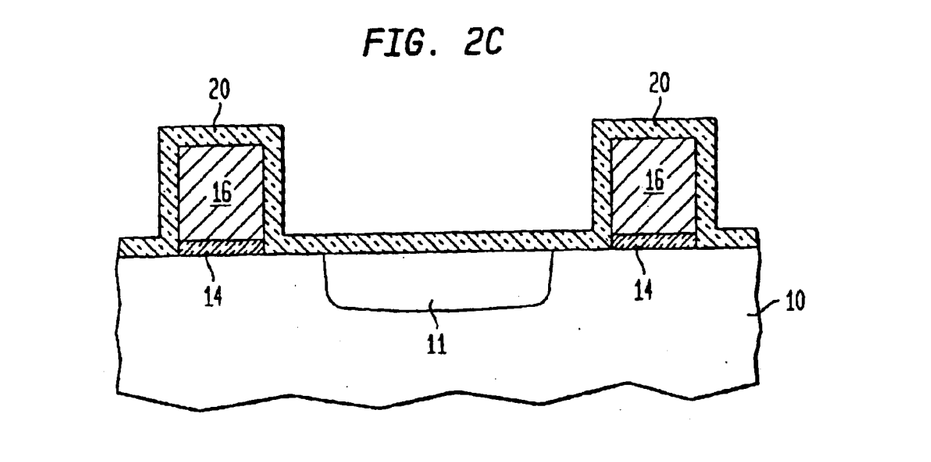

Following ion implantation of the deep source/drain regions into the substrate, Si-containing film 24 of composite spacer 18 is removed from the structure utilizing a conventional etching process which is highly selective in removing the Si-containing film as compared to either the gate material or the nitride layer. Specifically, the Si-containing film is removed from the structure utilizing a wet chemical etch process wherein a chemical etchant such as KOH is employed in selectively removing the Si-containing film. Alternatively, reactive-ion etching may be employed in selectively removing the Si-containing film from the composite spacer. Note that thin nitride layer 20 remains on the patterned structure after removal of the Si-containing film. The resultant structure that is obtained after the aforementioned removal step of the present invention is shown, for example, in FIG. 2C.

Figure 2D:
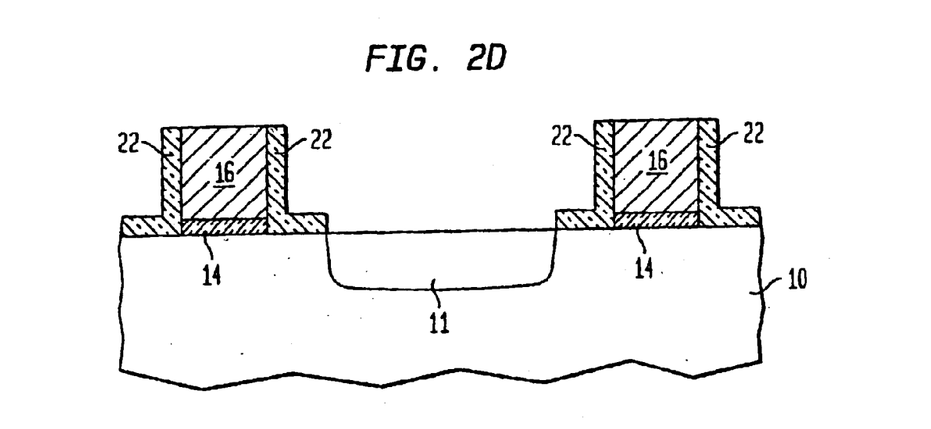

FIG. 2D illustrates the structure after L-shaped nitride spacers 22 are formed. Specifically, following the removal of the thick Si spacers, portions of nitride layer 20 are removed so as to form L-shaped spacers 22, each having vertical element $22v$ and horizontal element $22h$. Specifically, the L-shaped nitride spacers are formed utilizing an etching process which is capable of selectively removing portions of the nitride layer. Note a photoresist may be placed over portions of the nitride layer that are not to be removed during this etching step. A preferred etching process which is employed in the present invention in removing portions of the nitride layer includes a wet chemical etch process wherein a chemical etchant such as $H_3PO_4$ is employed. Using this etchant, the implanted regions of layer 20 are selectively etched leaving the unimplanted regions to form an L-shaped spacer.

Preferably, and at any time after the L-shaped nitride spacers are formed in the structure, the structure is subjected to a conventional activation annealing step which is capable of activating the shallow junctions, and optionally the deep source/drain regions. The activation annealing step is carried out utilizing the same conditions as mentioned hereinabove.

Next, with the conformal nitride layer on the structure, a conventional ion implantation process which is capable of forming shallow junctions is performed. The term "shallow junction" is used herein to denote an implant region whose maximum implant depth from the top surface of the substrate is from about 5 to about 50 nm. In the current invention, the implant energy is sufficient to penetrate under the L-shaped spacer forming extension regions near the gate.

Various ion implantation conditions may be used in forming the shallow junction regions within the substrate, but typically the ion implantation used in forming the shallow junction regions is carried out at a dopant dosage of about $2E15$ $cm^{-2}$ or less using an implant energy of about 20 keV or less. More preferably, the ion implantation used in forming the shallow junction regions is carried out at a dopant dosage of from about $3E14$ to about $1E15$ $cm^{-2}$ using an implant energy of from about 0.5 to about 5 keV.

Figure 2E:
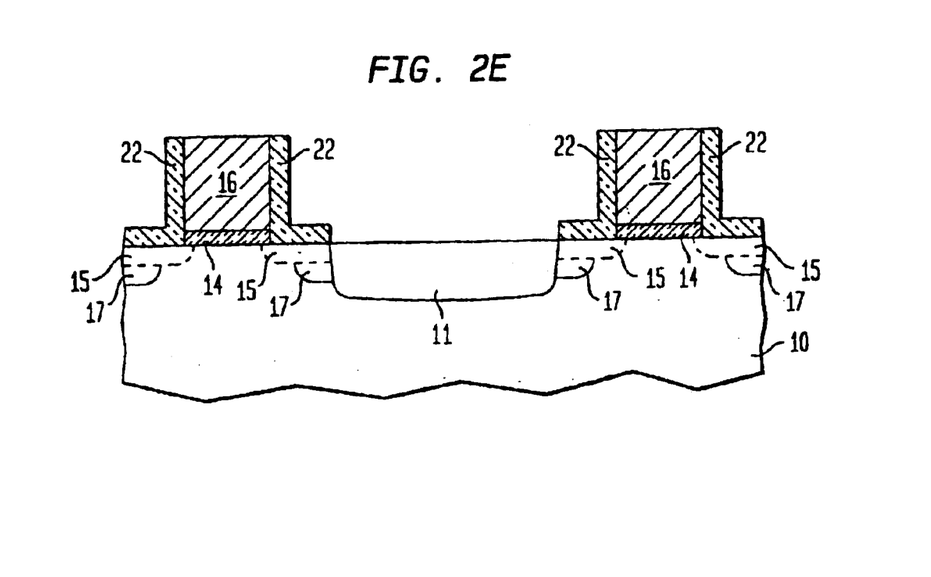

After implanting the shallow junction regions, halo implant regions 17 may be implanted into the surface of the semiconductor substrate providing the structure shown, for example, in FIG. 2E. These implant regions are formed utilizing conventional ion implantation processes well known to those skilled in the art. Following the implantation of the source/drain extensions regions and the halo implant regions, each implant region is subjected to a conventional activation annealing process that is capable of activating both the source/drain extension regions and the halo implant regions.

It should be noted that the extension regions near the channel of the CMOS device are abrupt, i.e., less than about 10 nm/decade. Note that the channel region is the portion of the semiconductor substrate which is beneath the patterned gate stack region. Additionally, the halo profile in proximity to the extension junction is also abrupt, i.e., less than about 30 nm/decade.

Figure 2F:
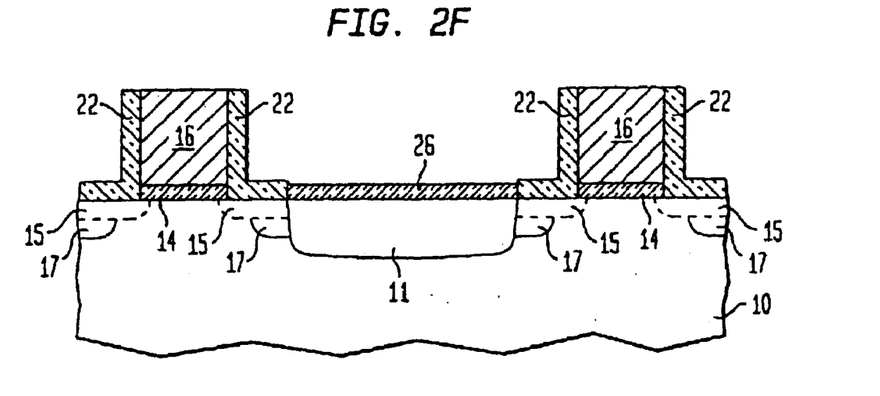

FIG. 2F shows the structure that is obtained after silicide contacts 26 are formed on portions of the semiconductor substrate 10 that are not protected by the horizontal element of the L-shaped nitride spacers. Specifically, the silicide contacts are formed utilizing a conventional silicidation process which includes the steps of forming a layer of refractory metal, such as Ti, Ni or Co, or metal alloy on the exposed surfaces of the semiconductor substrate; annealing the layer of refractory metal under conditions that are capable of converting said refractory metal layer into a refractory metal silicide layer and, if needed, removing any non-reactant refractory metal from the structure that was not converted into a silicide layer. A typical annealing temperature used in forming the silicide contacts in the present invention is about 350° C. or greater, with an annealing temperature of from about 450° C. or greater being more highly preferred. Note that because of the L-shaped nitride spacers, the silicide contacts are self-aligned to the deep junction 11 vertical edge present in the underlying substrate.

Note that in some embodiments of the present invention silicide regions are also formed atop each of the patterned gate stack regions. This embodiment of the present invention is not however depicted in the drawings of the present application.

Figure 3A:
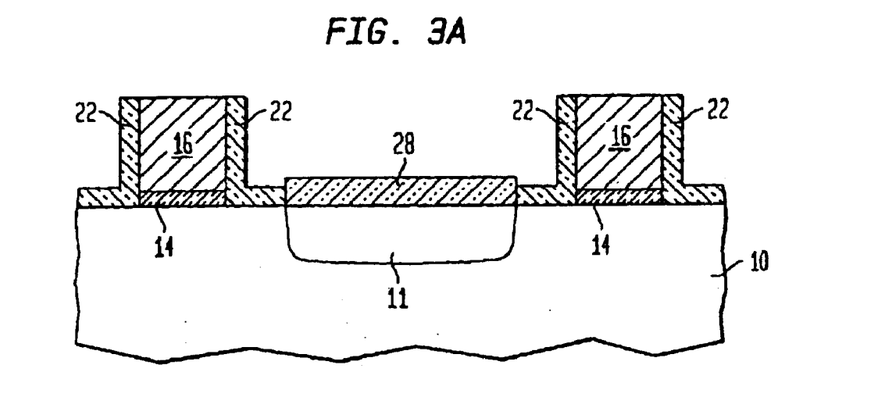
FIGS. 3A–C are pictorial representations (through cross-sectional views) showing an embodiment wherein an epi Si layer is formed in the structure.
Figure 3B:
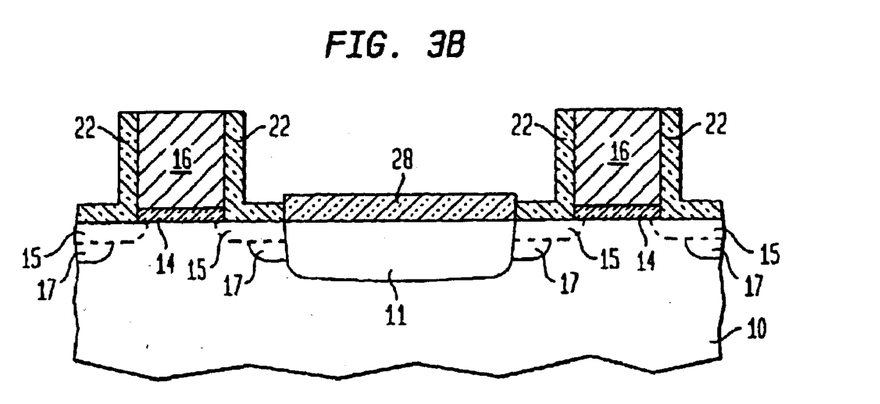
Figure 3C:
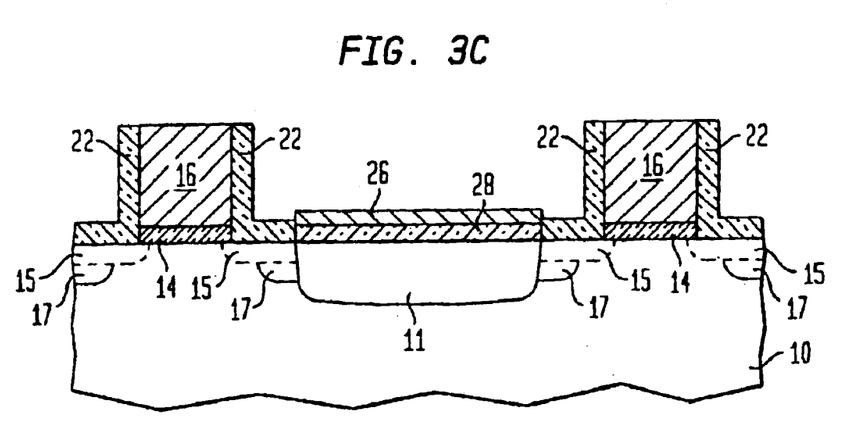

FIGS. 3A–3C show an embodiment of the present invention wherein raised/source drain regions are formed. Specifically, in this embodiment of the present invention, the processing steps leading up to the structure shown in FIG. 2D are first performed. Next, epi Si layer 28 is formed on exposed surfaces of semiconductor substrate 10 providing the structure shown in FIG. 3A. The epi Si layer is formed utilizing conventional epitaxial growing processes well known in the art. Following the formation of the epi Si layer, the source/drain extension regions and halo implant regions are formed in the structure utilizing the above mentioned processes providing the structure shown, for example, in FIG. 3B, Silicide contacts 26 are then formed on the epi Si layer utilizing a conventional silicidation process, as was also mentioned hereinabove, providing the structure shown, for example, in FIG. 3C.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a CMOS device comprising the steps of:
   (a) providing a plurality of patterned gate stack regions on a surface of a semiconductor substrate, wherein each of said patterned gate stack regions includes exposed vertical sidewalls;
   (b) forming a composite spacer on each exposed vertical sidewall, said composite spacer including a bilayer comprising a nitride layer and a Si-containing film, wherein said Si-containing film is thicker than said nitride layer and is formed on said nitride layer;
   (c) forming deep source and drain regions in said surface of said semiconductor substrate;
   d) removing said Si-containing film and forming shallow junctions in said semiconductor substrate in areas abutting each of said patterned gate stack regions;
   (e) removing portions of said nitride layer so as to form an L-shaped nitride spacer on each vertical sidewall of said patterned gate stack regions and activating said source and drain regions; and
   (t) forming silicide contacts in exposed regions of said semiconductor substrate not containing said L-shaped nitride spacer.

2. The method of claim 1 wherein step (a) comprises deposition, lithography and etching.

3. The method of claim 1 wherein said composite spacer is formed by sequentially depositing a conformal nitride layer and then said Si-containing film, and etching said Si-containing film.

4. The method of claim 3 wherein said etching comprises an anisotropic spacer etch process.

5. The method of claim 1 wherein said deep source and drain regions are formed by ion implantation.

6. The method of claim 5 wherein said ion implantation is performed using an ion dose of about 1E15 $cm^{-2}$ or greater and an implant energy of about 5 keV or greater.

7. The method of claim 6 wherein said ion implantation is performed using an ion dose of about 2E15 $cm^{-2}$ to about 2E16 $cm^{-2}$ and an implant energy of from about 7 to about 50 keV.

8. The method of claim 1 wherein said Si-containing film is removed by reactive-ion etching.

9. The method of claim 1 wherein said Si-containing film is removed by a selective wet chemical etch process.

10. The method of claim 9 wherein said selective wet chemical etch process includes the use of KOH.

11. The method of claim 1 wherein said shallow junctions are formed by ion implantation.

12. The method of claim 11 wherein said ion implantation is performed using an ion dose of about 2E15 $cm^{-2}$ or less and an implant energy of about 20 keV or less.

13. The method of claim 12 wherein said ion implantation is performed using an ion dose of from about 3E14 to about 1E15 $cm^{-2}$ and an implant energy of from about 0.5 to about 5 keV.

14. The method of claim 1 wherein said L-shaped nitride spacers are formed by a selective, wet chemical etch process.

15. The method of claim 14 wherein said selective wet chemical etch process includes $H_3PO_4$ as an etchant.

16. The method of claim 1 wherein halo implant regions and source/drain regions are formed between steps (e) and (f).

17. The method of claim 1 wherein said silicide contacts are formed by a silicidation process.

18. The method of claim 17 wherein said silicidation process comprises the steps of: forming a refractory metal on exposed surfaces of said semiconductor substrate, annealing said refractory metal so as to convert said refractory metal into a metal silicide, and optionally, removing any non-reactant refractory metal.

19. The method of claim 18 wherein said annealing is performed at a temperature of about 350° C. or greater.

20. The method of claim 19 wherein said annealing is performed at a temperature of about 450° C. or greater.

21. The method of claim 1 wherein an epi Si layer is formed on exposed surfaces of said semiconductor substrate between steps (e) and (f).

22. The method of claim 21 wherein said epi Si layer is formed by a selective epitaxial growing process.

* * * * *

UNITED STATES PATENT AND TRADEMARK OFFICE
CERTIFICATE OF CORRECTION

PATENT NO.   : 6,727,135 B2
DATED        : April 27, 2004
INVENTOR(S)  : Kam Leung Lee et al.

It is certified that error appears in the above-identified patent and that said Letters Patent is hereby corrected as shown below:

Column 10,
Line 5, "(t)" should read -- (f) --

Signed and Sealed this

Nineteenth Day of April, 2005

JON W. DUDAS
*Director of the United States Patent and Trademark Office*